(12) United States Patent
Kim et al.

(10) Patent No.: US 7,170,183 B1
(45) Date of Patent: Jan. 30, 2007

(54) WAFER LEVEL STACKED PACKAGE

(75) Inventors: Bong Chan Kim, Seoul (KR); Yoon Joo Kim, Seoul (KR); Ji Young Chung, Kyeonggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/128,633

(22) Filed: May 13, 2005

(51) Int. Cl.
H01L 23/48 (2006.01)
H01L 23/31 (2006.01)
H05K 3/34 (2006.01)
H05K 1/14 (2006.01)
H01I 23/13 (2006.01)

(52) U.S. Cl. .............. 257/777; 257/E23.061; 257/E23.125; 257/E23.005; 257/E23.008; 257/E23.026; 257/E23.067; 257/E23.013; 257/E23.105; 257/E25.023; 257/686; 257/685; 257/723; 257/778; 257/737; 257/738; 257/698

(58) Field of Classification Search ........... 257/777, 257/723, 684–686, 778, 734, 737, 738, 725, 257/728, 784, 773, 698, 690–693, E23.061, 257/E23.125, E23.005, E23.008, E23.026, 257/E23.067
See application file for complete search history.

(56) References Cited

U.S. PATENT DOCUMENTS

| 6,493,240 | B2 * | 12/2002 | Broglia et al. ............. 361/803 |
| 6,815,712 | B1 * | 11/2004 | Kline ........................ 257/48 |
| 6,835,895 | B1 * | 12/2004 | Asai et al. ................. 174/255 |
| 6,876,088 | B2 * | 4/2005 | Harvey ...................... 257/778 |
| 6,906,415 | B2 * | 6/2005 | Jiang et al. ................. 257/723 |
| 6,949,407 | B2 * | 9/2005 | Jeung et al. ............... 438/106 |
| 2002/0031864 | A1 * | 3/2002 | Ball .......................... 438/113 |
| 2003/0042587 | A1 * | 3/2003 | Lee ........................... 257/678 |
| 2003/0089978 | A1 * | 5/2003 | Miyamoto et al. .......... 257/723 |
| 2003/0138993 | A1 * | 7/2003 | Nakamura et al. ......... 438/107 |
| 2003/0232462 | A1 * | 12/2003 | Poo et al. .................. 438/117 |
| 2004/0012078 | A1 * | 1/2004 | Hortaleza .................. 257/678 |
| 2004/0104469 | A1 * | 6/2004 | Yagi et al. ................. 257/723 |
| 2004/0178514 | A1 * | 9/2004 | Lee et al. .................. 257/787 |
| 2006/0006521 | A1 * | 1/2006 | Boon et al. ................ 257/701 |
| 2006/0043603 | A1 * | 3/2006 | Ranade et al. ............. 257/778 |

* cited by examiner

*Primary Examiner*—Alexander Oscar Williams
(74) *Attorney, Agent, or Firm*—Gunnison, McKay & Hodgson, L.L.P.; Serge J. Hodgson

(57) ABSTRACT

Disclosed are a wafer level stacked package and its manufacturing method. As one example, in such a wafer level stacked package, a first semiconductor die is electrically connected to an upper surface of a substrate and a second semiconductor die is electrically connected to a lower surface of the substrate. That is, with respect to one substrate, semiconductor dies can be stacked on upper and lower surfaces of the substrate. Also, underfill is formed between the respective semiconductor dies and the substrate, thereby enhancing bonding forces between the respective semiconductor dies and the substrate. In addition to stacking the semiconductor dies, packages can be stacked with each other. That is, it is possible to stack a plurality of completed wafer level packages with each other in an up-and-down direction.

17 Claims, 14 Drawing Sheets

WAFER LEVEL STACKED PACKAGE

BACKGROUND OF THE INVENTION

1. Field of the Invention

The present invention relates to a wafer level stacked package and a method for manufacturing the same.

2. Description of the Related Art

In general, a wafer level package refers to a package in which all packaging processes are completed on a wafer and so the size of the package is similar to that of a semiconductor die. This wafer level package can not only shorten the manufacturing process, but also steeply reduce materials used for the semiconductor assembly, thereby making it possible to save cost of production.

Such a wafer level package comprises a semiconductor die, a substrate electrically connected to the semiconductor die, an encapsulant encapsulating the semiconductor die, and electrically conductive terminals formed on one side of the substrate to be packaged in an external device. Also, a manufacturing method of this wafer level package includes an operation of placing a substrate, which is formed with a plurality of electrically conductive patterns, on a wafer and simultaneously electrically connecting each semiconductor die of the wafer to each unit of the substrate, an operation of forming electrically conductive terminals on one side of the substrate, an operation of encapsulating the respective semiconductor dies of the wafer and the substrate, and an operation of sawing the respective semiconductors die together with the substrate from the wafer to obtain individual independent semiconductor packages.

However, the conventional wafer level package and its manufacturing method as stated above have a drawback in that it is difficult to innovatively improve memory capacity or functionality because only one semiconductor die is located on the substrate. For example, two or more memory chips, a memory chip and a DSP (Digital Signal Processor), a memory chip and a PLC (Programmable Logic Controller) or the like cannot be formed into one semiconductor package when the package has only one substrate. Also, it is not possible to stack two or more finished wafer level packages with each other, which goes against the trend toward the development of a high-capacity and high-functional semiconductor package.

Furthermore, since the manufacturing method of the conventional wafer level package includes the process of encapsulating the semiconductor die with the encapsulant, not only the manufacturing process becomes complex, but also the semiconductor die completely surrounded by the encapsulant significantly deteriorates heat radiation property and electrical performance of the package.

SUMMARY OF THE INVENTION

Disclosed are a wafer level stacked package and its manufacturing method. As one example, in such a wafer level stacked package, a first semiconductor die is electrically connected to an upper surface of a substrate and a second semiconductor die is electrically connected to a lower surface of the substrate. That is, with respect to one substrate, semiconductor dies can be stacked on upper and lower surfaces of the substrate. Also, underfill is formed between the respective semiconductor dies and the substrate, thereby enhancing bonding forces between the respective semiconductor dies and the substrate. In addition to stacking the semiconductor dies, packages can be stacked with each other. That is, it is possible to stack a plurality of completed wafer level packages with each other in an up-and-down direction.

The present invention will be more apparent from the following detailed description taken in conjunction with the accompanying drawings.

DETAILED DESCRIPTION

Figure 1A:
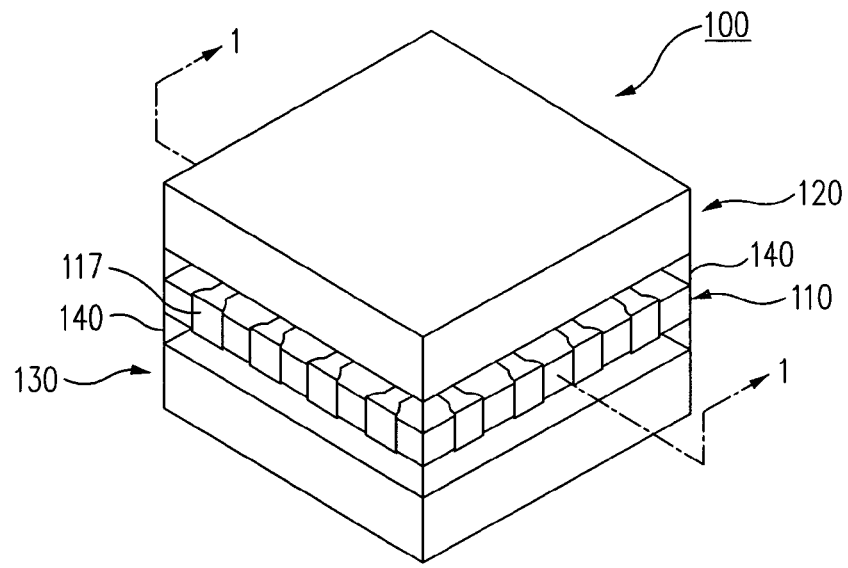
FIG. 1A is a perspective view of a wafer level stacked package in accordance with an embodiment of the present invention and FIG. 1B is a sectional view taken along line 1—1 in FIG. 1A.
Figure 1B:
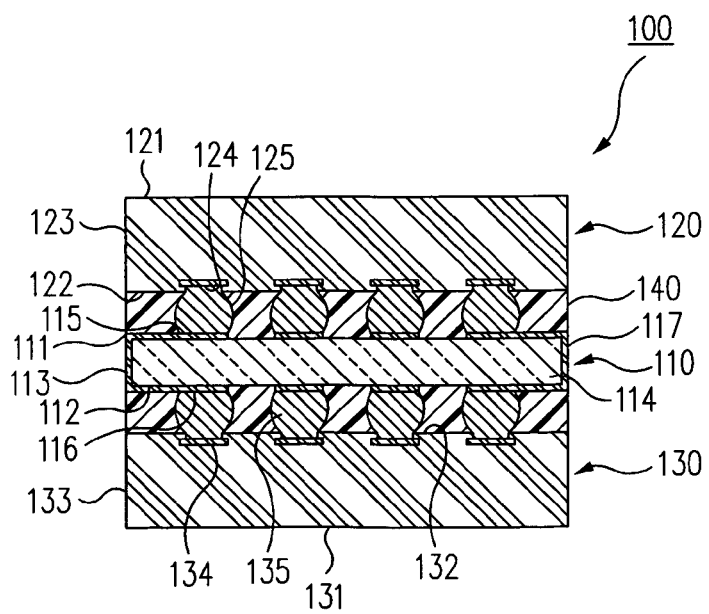

Referring to FIGS. 1A and 1B, FIG. 1A illustrates a perspective view of a wafer level stacked package in accordance with an embodiment of the present invention and FIG. 1B illustrates a sectional view taken along line 1—1 in FIG. 1A.

As shown in the drawings, the wafer level stacked package 100 in accordance with this embodiment of the present invention generally includes a substrate 110, a first semiconductor die 120 located on one surface of the substrate 110 and a second semiconductor die 130 located on an opposite surface of the substrate 110.

First of all, the substrate 110 includes an insulative layer 114 which has a first approximately planar surface 111, a second approximately planar surface 112 opposite to the first surface 111, and four third surfaces 113 formed around and perpendicular to the first and second surfaces 111, 112. Such an insulative layer 114 has a predetermined thickness and may be made of hard material, soft material or equivalents thereof, but its material need not be limited to these. The first surface 111 of the insulative layer 114 is formed with at least a first electrically conductive pattern 115, the second surface 112 is also formed with at least a second electrically conductive pattern 116, and the third surfaces 113 are formed with electrically conductive terminals 117 electrically connected to the first electrically conductive pattern 115 and/or the second electrically conductive pattern 116. Here, the first and second electrically conductive patterns 115, 116 may be formed of copper, gold, silver, palladium or equivalents thereof, but their material need not be limited to these. The electrically conductive terminals 117 are also formed of copper, gold, silver, palladium or equivalents thereof, but their material need not be limited to these.

The first semiconductor die 120 is located on the first surface 111 of the insulative layer 114 of the substrate 110. This first semiconductor die 120 has a first approximately planar surface 121, a second approximately planar surface 122 opposite to the first surface 121 and formed with at least a bond pad 124, and four third surfaces 123 formed around and perpendicular to the first and second surfaces 121, 122. At this time, each third surface 123 of the first semiconductor die 120 and each corresponding third surface 113 of the insulative layer 114 of the substrate 110 may form the approximately same plane. Also, the bond pad 124 of the first semiconductor die 120 and the first electrically conductive pattern 115 of the substrate 110 may be connected to each other by an electrically conductive bump 125. Thus, an electrical signal from the first semiconductor die 120 can be transferred to an external device via the electrically conductive bump 125, the first electrically conductive pattern 115 and the electrically conductive terminal 117. The electrical conductive bump 125 may be made of ordinary solder, gold, silver or equivalents thereof, but its material need not be limited to these. Also, the first semiconductor die 120 may be any integrated circuit such as an ordinary memory chip, a flash memory chip, a DSP, a PLC and so forth. Although the electrically conductive bump 125 is cited herein by way of example, an LGA (Land Grid Array) may be employed other than the electrically conductive bump. That is, it is possible to employ a structure in which the bond pad of the first semiconductor die is formed with an electrically conductive land instead of the electrically conductive bump and this land is electrically connected to the substrate. Such an LGA structure can be applied to all semiconductor dies to be described below.

The second semiconductor die 130 is located underneath the second surface 112 of the insulative layer 114 of the substrate 110. This second semiconductor die 130 has a first approximately planar surface 131, a second approximately planar surface 132 opposite to the first surface 131 and formed with at least a bond pad 134, and four third surfaces 133 formed around and perpendicular to the first and second surfaces 131, 132. At this time, each third surface 133 of the second semiconductor die 130 and each corresponding third surface 113 of the insulative layer 114 of the substrate 110 may form the approximately same plane. That is, the respective corresponding third surfaces 123, 133, 113 of the first semiconductor die 120, the second semiconductor die 130 and the insulative layer 114 of the substrate 110 may lie in the approximately same plane. Also, the bond pad 134 of the second semiconductor die 130 and the second electrically conductive pattern 116 of the substrate 110 may be connected to each other by an electrically conductive bump 135. Of course, the electrical conductive bump 135 may be made of ordinary solder, gold, silver or equivalents thereof, but its material need not be limited to these. In a similar way, the second semiconductor die 130 may be any integrated circuit such as an ordinary memory chip, a flash memory chip, a DSP, a PLC and so forth.

In addition, an underfill 140 may be further interposed between the first semiconductor die 120 and the substrate 110 and/or between the second semiconductor die 130 and the substrate 110 so as to prevent oxidation of the electrically conductive bumps 125, 135 and enhance bonding forces between the semiconductor dies 120, 130 and the substrate 110. Such an underfill 140 may be formed of ordinary epoxy, silicon or equivalents thereof, but its material need not be limited to these. In order not to enlarge a width of the wafer level stacked package 100, the underfill 140 is suitably formed such that it does not projected out of the third surfaces 113, 123, 133 of the substrate 110, the first semiconductor die 120 and the second semiconductor die 130.

In this way, the present invention provides the wafer level stacked package 100 in which, with respect to one substrate 110, the first semiconductor die 120 and the second semiconductor die 130 can be stacked on upper and lower surfaces of the substrate, respectively.

Moreover, in spite of stacking the semiconductor dies 120, 130, the semiconductor package 100 can be considerably reduced in area (or width) because its area (or width) does not exceed the area (or width) of one semiconductor die, and the package 100 can be manufactured by wafer-level operations.

Furthermore, since one first surface 121 and four third surfaces 123 formed in the first semiconductor die 120, and one first surface 131 and four third surfaces 133 formed in the second semiconductor die 130 are all exposed to the atmosphere, the wafer level stacked package 100 has an excellent heat radiation property and so improved electrical performance.

Figure 2A:
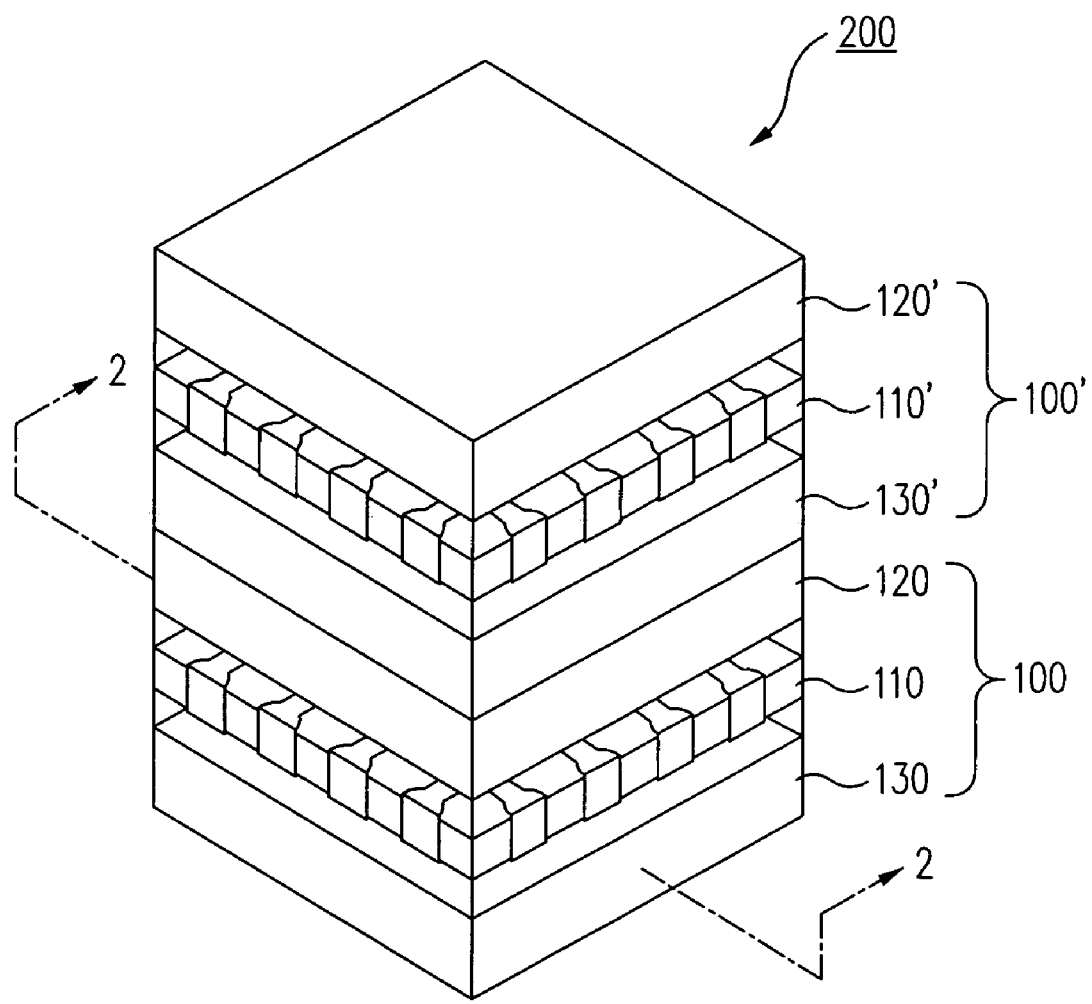
FIG. 2A is a perspective view of a wafer level stacked package in accordance with another embodiment of the present invention and FIG. 2B is a sectional view taken along line 2—2 in FIG. 2A.
Figure 2B:
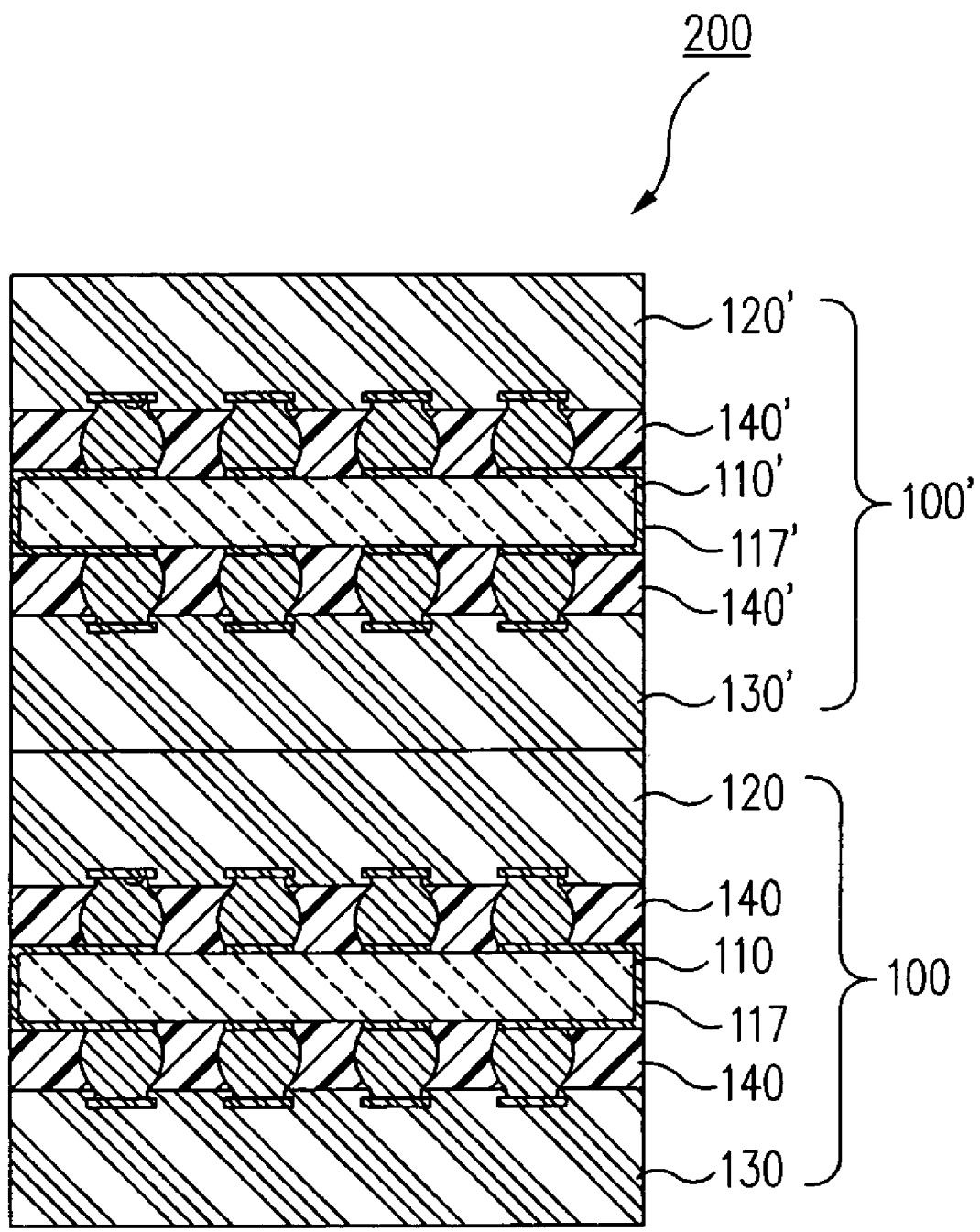

Referring to FIGS. 2A and 2B, FIG. 2A illustrates a perspective view of a wafer level stacked package in accordance with another embodiment of the present invention and FIG. 2B illustrates a sectional view taken along line 2—2 in FIG. 2A.

As shown in the drawings, in the wafer level stacked package 200 in accordance with this embodiment of the present invention, the packages can be stacked with each other. In other words, it is possible to not only stack the first semiconductor die 120 and the second semiconductor die 130 on upper and lower surfaces of one substrate 110 as stated above, but also stack wafer level stacked packages 100 with each other, in which the semiconductor dies are stacked in that manner.

To be specific, a second semiconductor die 130' of one wafer level stacked package 100' can be adhered on a first semiconductor die 120 of the other wafer level semiconductor die 100. Of course, the adhesion may be carried out with an ordinary adhesive, moisture or equivalents thereof, but the material and the way to adhere the semiconductor dies need not be limited to these. When moisture is used for the adhesion, it is suitable that some heat is applied to the first and second semiconductor dies 120, 130' to form an oxide film therebetween. Substrate 110', electrically conductive terminals 117', first semiconductor die 120', second semiconductor die 130', underfill 140' of package 100' are the same or substantially similar to substrate 110, electrically conductive terminals 117, first semiconductor die 120, second semiconductor die 130, underfill 140 of package 100, respectively.

Also, although the drawings illustrate a wafer level stacked package 200 in which two packages 100, 100' are stacked with each other, the present invention is not limited to this. That is, three or more packages may be stacked with each other.

Moreover, although two wafer level packages 100, 100' shown in the drawings have the same area (or width), their areas (or widths) may be different from each other. This is due to the fact that the semiconductor dies are easily adhered to each other only if their surfaces in contact with each other are planar.

Figure 3A:
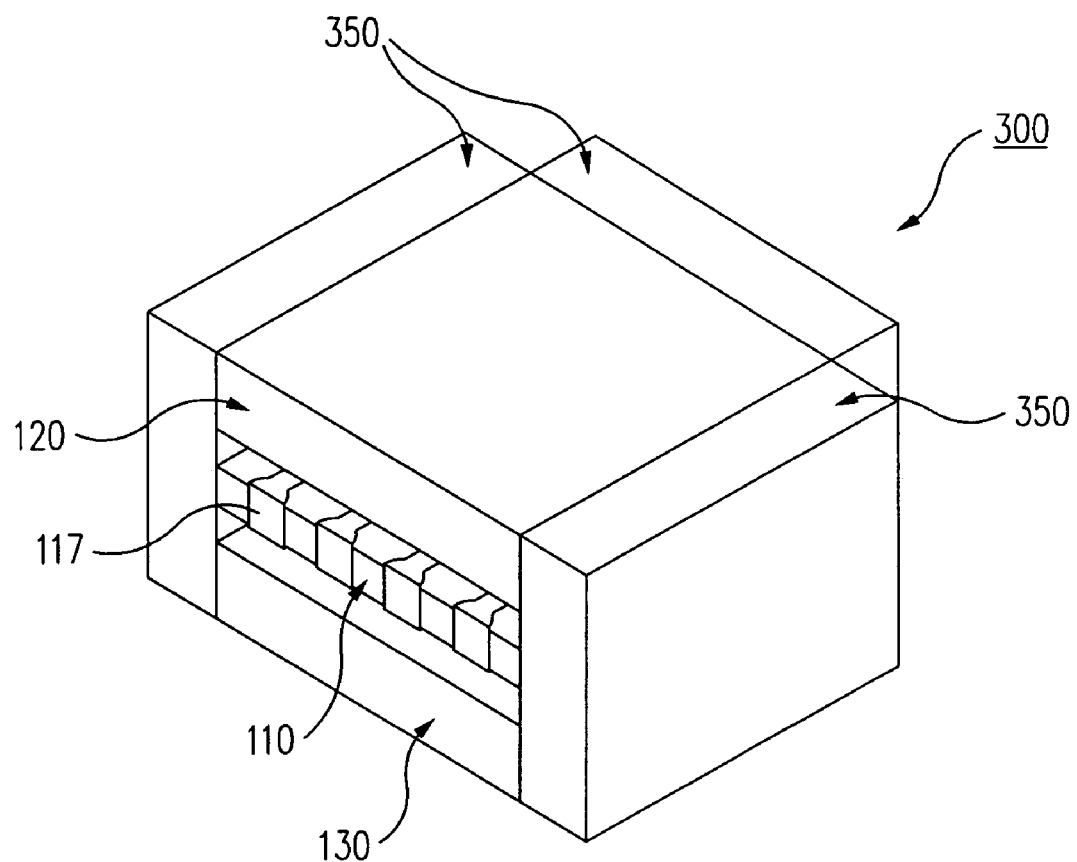
FIG. 3A is a perspective view of a wafer level stacked package in accordance with still another embodiment of the present invention and FIG. 3B is a partially exploded perspective view of the wafer level stacked package shown in FIG. 3A.
Figure 3B:
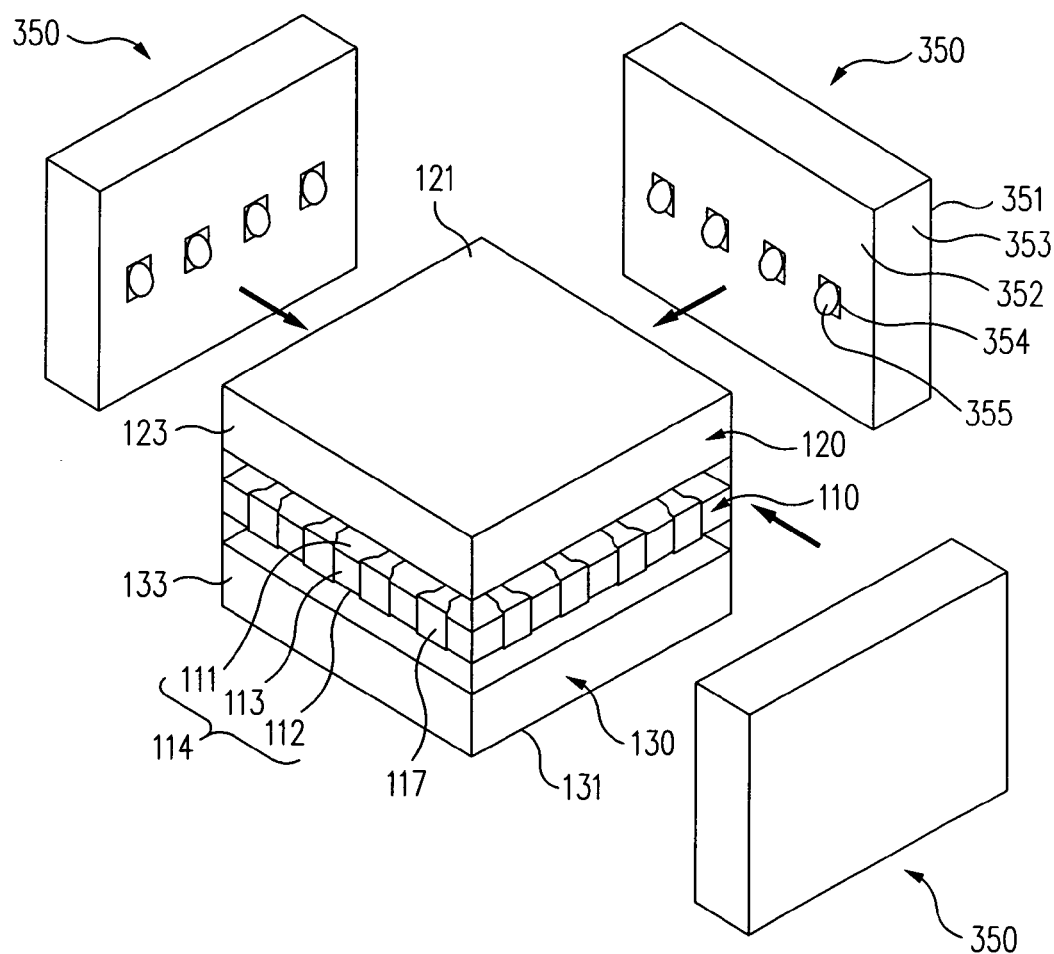

Referring to FIGS. 3A and 3B, FIG. 3A illustrates a perspective view of a wafer level stacked package in accordance with still another embodiment of the present invention and FIG. 3B illustrates a partially exploded perspective view of the wafer level stacked package shown in FIG. 3A.

As shown in the drawings, in the wafer level stacked package 300 in accordance with this embodiment of the present invention, the packages can be stacked in a horizontal direction other than a vertical direction. That is, at least a further semiconductor die 350, sometimes called at least one third semiconductor die 350, can be connected to electrically conductive terminals 117 formed on an insulative layer 114 of a substrate 110. To be specific, bond pads 354 of a further semiconductor die 350 can be connected to electrically conductive terminals 117, which are formed on third surfaces 113 of the insulative layer 114, through electrically conductive bumps 355. Also, further semiconductor dies 350 may be connected to three third surfaces 113 out of four third surfaces 113 formed in the insulative layer 114, except for at least one third surface 113. Of course, the electrically conductive terminals formed on the third surface 113 to which the semiconductor die 350 is not connected will be connected to an external device later.

Here, the semiconductor die 350 may also have a first approximately planar surface 351, a second approximately planar surface 352 opposite to the first surface 351 and formed with at least a bond pad 354, and four third surfaces 353 formed around and perpendicular to the first and second surfaces 351, 352.

Also, the upper third surface 353 of the semiconductor die 350 is approximately flush with a first surface 121 of a first semiconductor die 120, and the lower third surface 353 of the semiconductor die 350 is approximately flush with a first surface 131 of a second semiconductor die 130. The lateral third surfaces 353 of the semiconductor die 350 and third surfaces 123, 133 of the first semiconductor die 120 and/or the second semiconductor die 130 form the approximately same planes, respectively.

In addition, the semiconductor die 350 may be formed with a height corresponding to a distance from the first surface 121 of the first semiconductor die 120 to the first surface 131 of the second semiconductor die 130 and with the same width as those of the respective semiconductor dies 120, 130, but the present invention is not limited to such height and width.

Figure 4A:
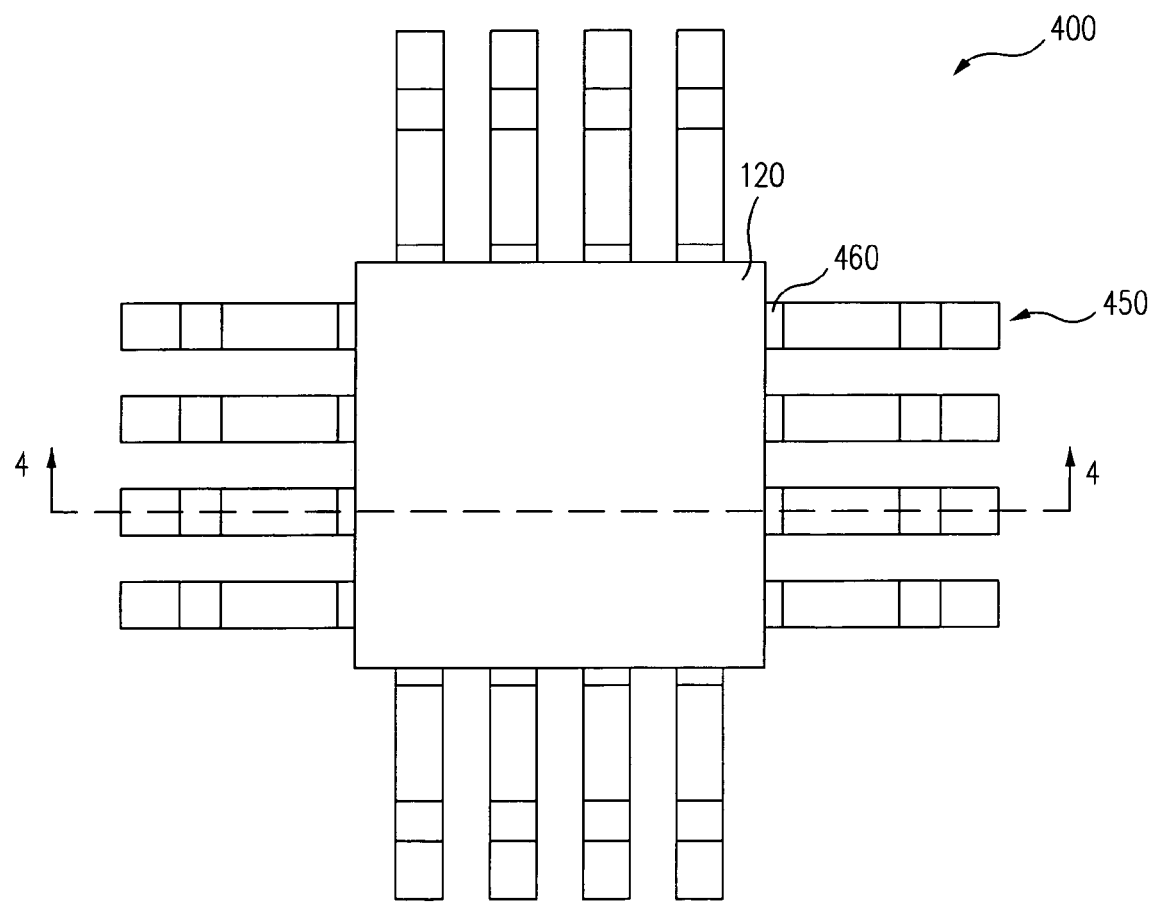
FIG. 4A is a plan view of a wafer level stacked package in accordance with still yet another embodiment of the present invention and FIG. 4B is a sectional view taken along line 4—4 in FIG. 4A.
Figure 4B:
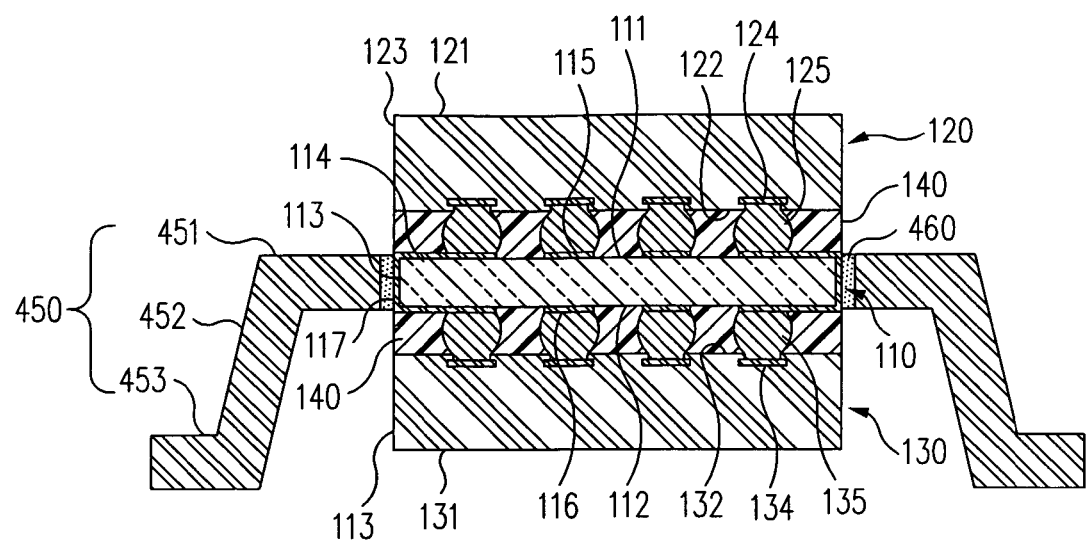

Referring to FIGS. 4A and 4B, FIG. 4A illustrates a plan view of a wafer level stacked package in accordance with still yet another embodiment of the present invention and FIG. 4B illustrates a sectional view taken along line 4—4 in FIG. 4A.

As shown in the drawings, in the wafer level stacked package 400 in accordance with this embodiment of the present invention, at least a lead 450 can be further connected to sides of a substrate 110. To be specific, leads 450 are further connected to electrically conductive terminals 117, which are formed on third surfaces 113 of an insulative layer 114, by means of solders 460. Of course, each distal end of the leads 450 is bent at a predetermined angle so as to be easily packaged in an external device. Consequently, electrical signals from the electrically conductive terminals 117 of the substrate 110 can be transferred to an external device via the leads 450. Here, the lead 450 may be formed of ordinary copper, a copper alloy or equivalents thereof, but its material need not be limited to these. Also, the lead 450 may include a first region 451 connected to the electrically conductive terminal 117 by means of the solder 460, a second region 452 inclined outwardly and downwardly from the first region 451, and a third region 453 extending outwardly and horizontally from the second region 452 by a predetermined length, but the present invention is not limited to such a form.

Figure 5A:
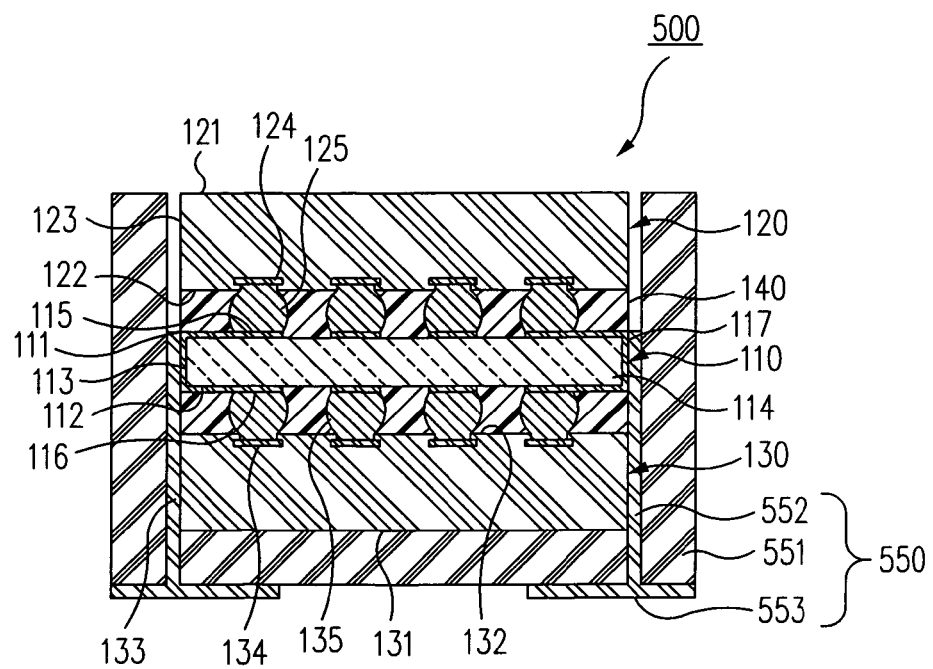
FIG. 5A is a sectional view of a wafer level stacked package in accordance with still yet another embodiment of the present invention and FIG. 5B is a partially exploded sectional view of the wafer level stacked package shown in FIG. 5A.
Figure 5B:
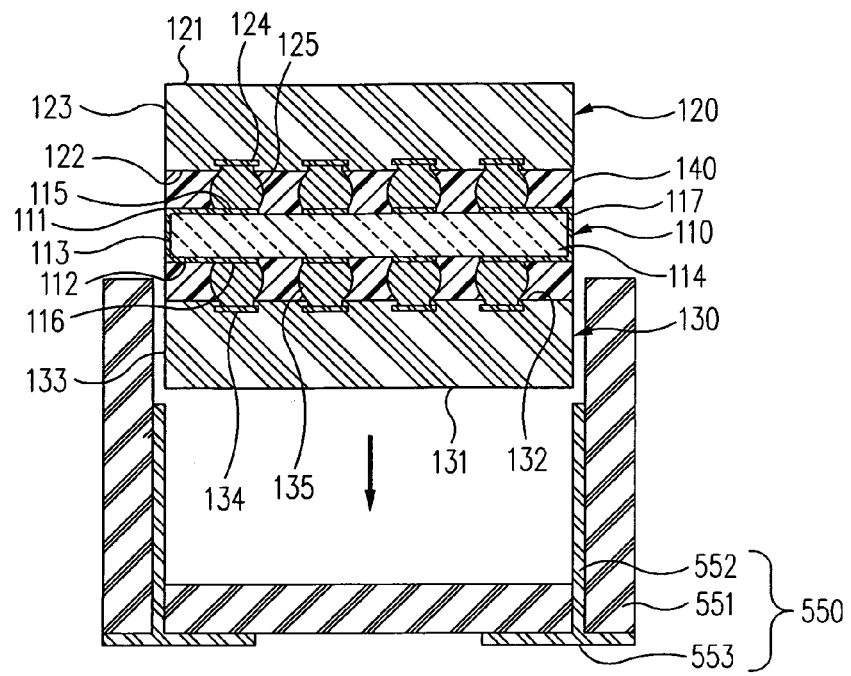

Referring to FIGS. 5A and 5B, FIG. 5A illustrates a sectional view of a wafer level stacked package in accordance with still yet another embodiment of the present invention and FIG. 5B illustrates a partially exploded sectional view of the wafer level stacked package shown in FIG. 5A.

As shown in the drawings, in the wafer level stacked package 500 in accordance with this embodiment of the present invention, a substrate 110, a first semiconductor die 120 and a second semiconductor die 130 can be coupled to a socket 550 having a predetermined shape. As one example, the socket 550 may include an insulative body 551 having a hexahedral shape upper portion of which is opened, at least an electrically conductive pattern 552 formed on an inner wall surface of the insulative body 551, and an electrically conductive pad 553 formed on an outer lower surface of the insulative body 551 and connected to the electrically conductive patterns 552. Of course, the electrically conductive patterns 552 formed on the inner wall surface of the insulative body 551 are electrically connected to electrically conductive terminals 117 formed in the substrate 110. That is, at least an electrically conductive terminal 117 formed on third surfaces 113 of an insulative layer 114 constituting the substrate 110 is electrically connected to the electrically conductive patterns 552 formed on the inner wall surface of the insulative body 551. Consequently, electrical signals from the electrically conductive terminals 117 can be transferred to an external device via the electrically conductive patterns 552 and the electrically conductive pad 553 of the socket 550. Here, the socket 550 may be formed of ordinary plastic, thermoset, ceramic or equivalents thereof, and the electrically conductive pattern 552 and the electrically conductive pad 553 may be formed of ordinary copper, an copper alloy or equivalents thereof, but their materials need not be limited to these.

Of course, the above-mentioned package 200 shown in FIGS. 2A and 2B can be also coupled to the socket 550.

Figure 6A:
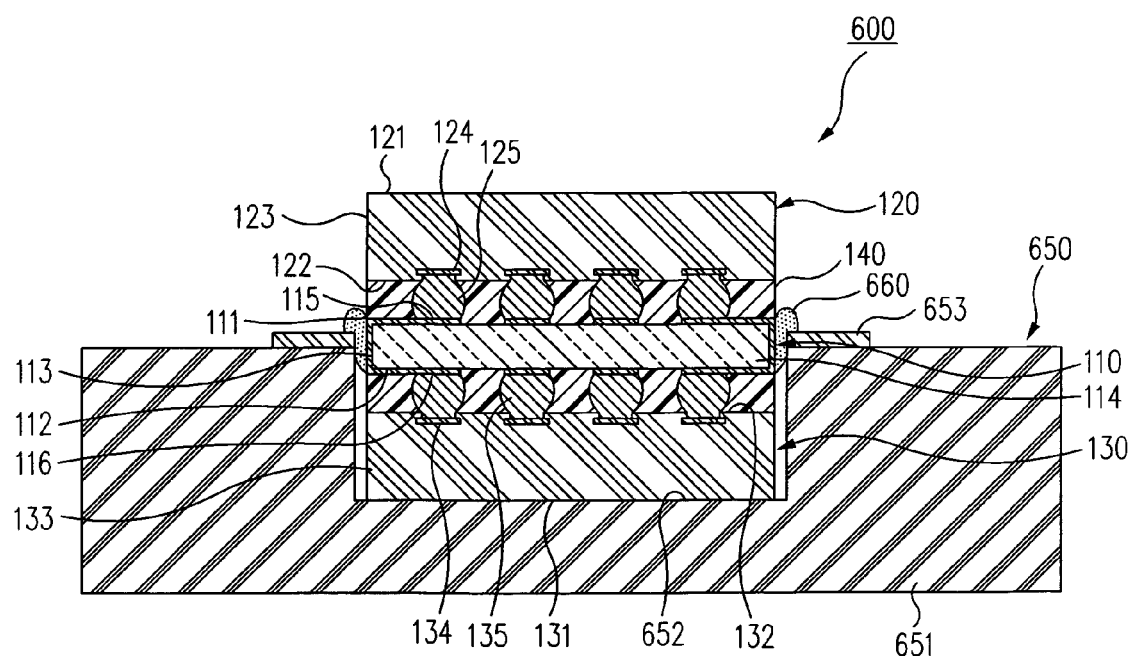
FIG. 6A is a sectional view of a wafer level stacked package in accordance with still yet another embodiment of the present invention and FIG. 6B is a partially exploded sectional view of the wafer level stacked package shown in FIG. 6A.
Figure 6B:
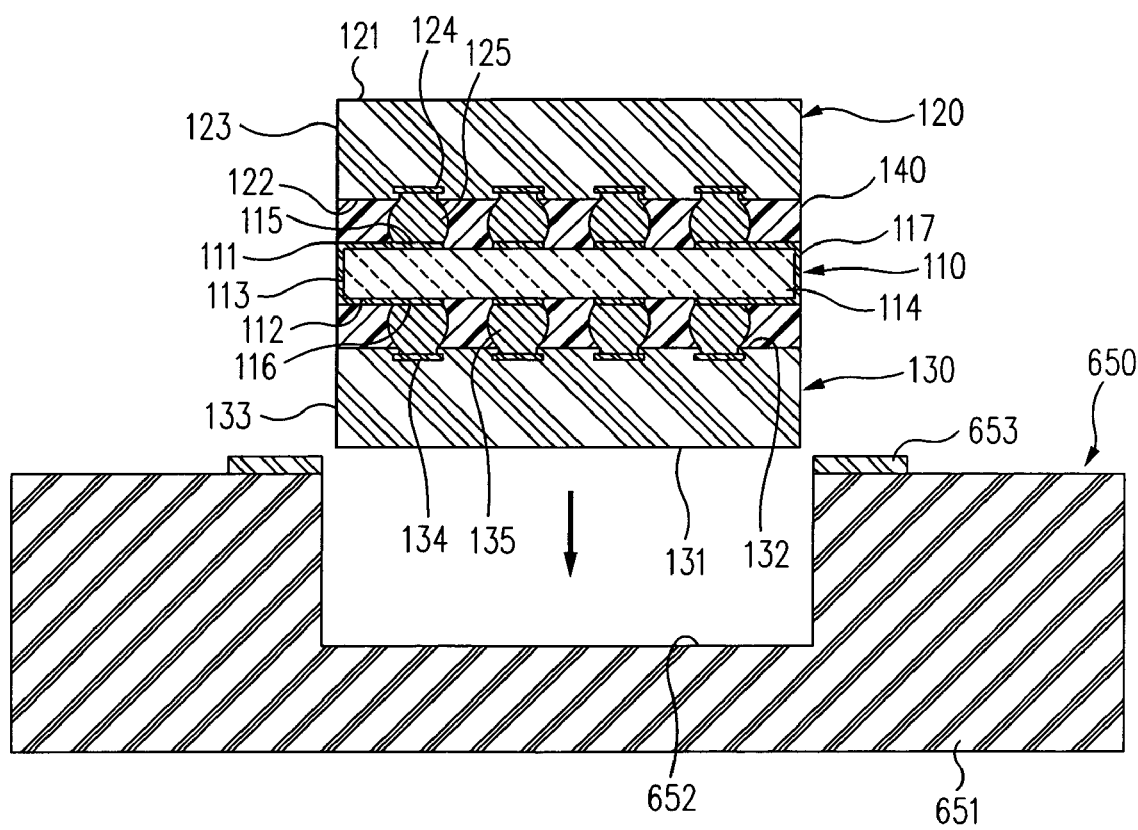

Referring to FIGS. 6A and 6B, FIG. 6A illustrates a sectional view of a wafer level stacked package in accordance with still yet another embodiment of the present invention and FIG. 6B illustrates a partially exploded sectional view of the wafer level stacked package shown in FIG. 6A.

As shown in the drawings, in the wafer level stacked package 600 in accordance with this embodiment of the present invention, a substrate 110, a first semiconductor die 120 and a second semiconductor die 130 can be coupled to a cavity 652 of an external board 650. As one example, the external board 650 may includes an insulative body 651 formed with a cavity 652 having predetermined depth and width and at least an electrically conductive pattern 653 formed on a surface of the insulative body 651 in the outside of the cavity 652. Also, the substrate 110 and the second semiconductor die 130 can be substantially coupled within the cavity 652, wherein electrically conductive terminals 117 formed in the substrate 110 may be connected to the electrically conductive patterns 653 by means of solders 660. That is, electrically conductive terminals 117 formed on third surfaces 113 of an insulative layer 114 constituting the substrate 110 are electrically connected to the electrically conductive patterns 653 formed at an outer periphery of the cavity 652 constituting the external board 650.

Of course, the above-mentioned package 200 shown in FIGS. 2A and 2B can be also coupled to the external board 650.

Figure 7A:
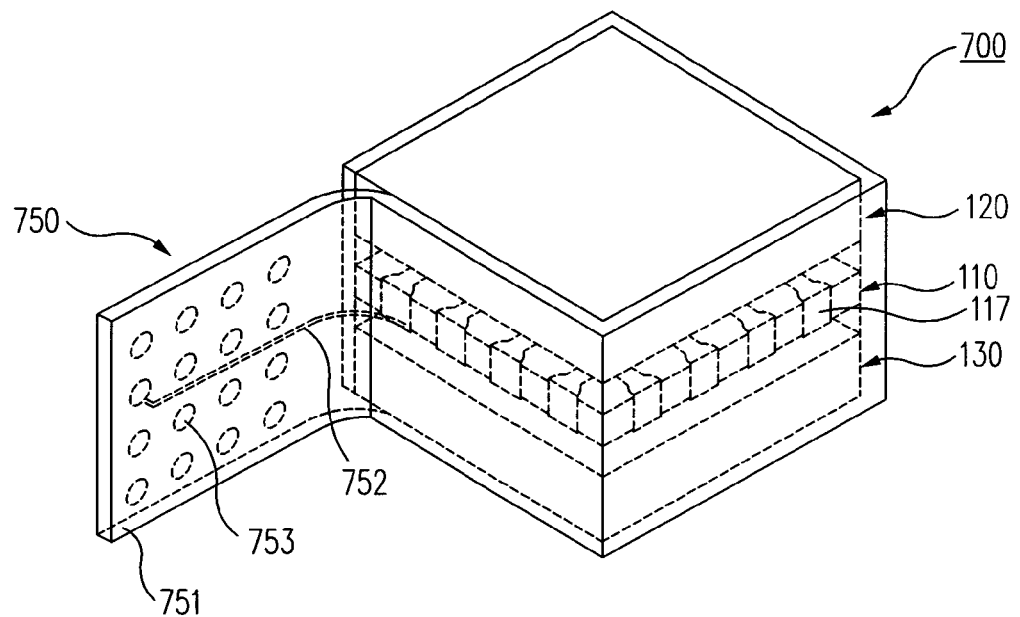
FIG. 7A is a perspective view of a wafer level stacked package in accordance with still yet another embodiment of the present invention and FIG. 7B is a partially exploded perspective view of the wafer level stacked package shown in FIG. 7A.
Figure 7B:
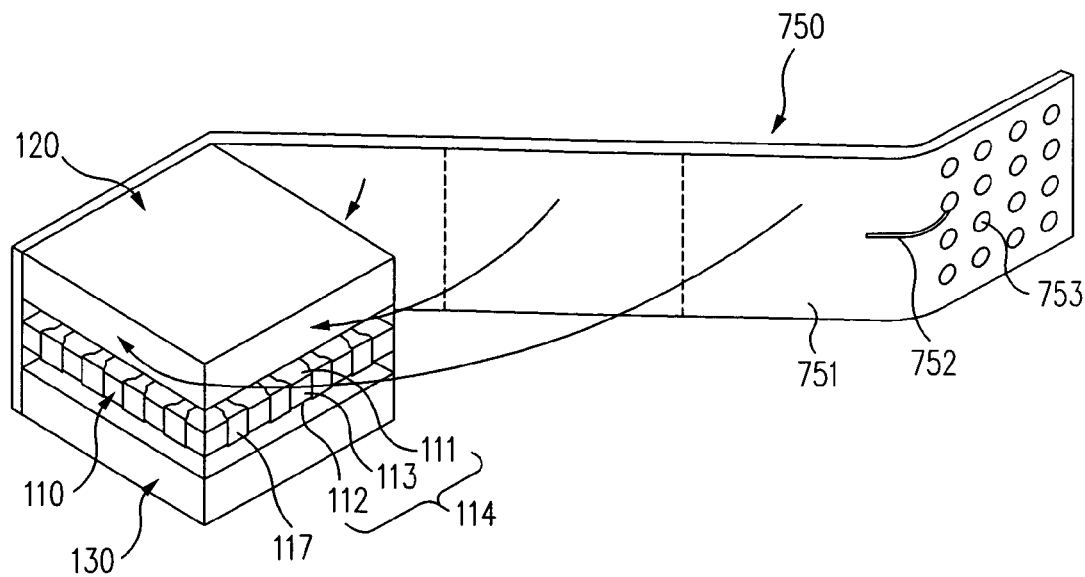

Referring to FIGS. 7A and 7B, FIG. 7A illustrates a perspective view of a wafer level stacked package in accordance with still yet another embodiment of the present invention and FIG. 7B illustrates a partially exploded perspective view of the wafer level stacked package shown in FIG. 7A.

As shown in the drawings, in the wafer level stacked package 700 in accordance with this embodiment of the present invention, all of electrically conductive terminals 117 can be connected to electrically conductive patterns 752 of a soft circuit board 750, sometimes called a flexible circuit board 750. That is, electrically conductive patterns 752 of a soft circuit board 750 having flexibility in a predetermined direction can be connected to electrically conductive terminals 117 formed on third surfaces 113 of an insulative layer 114 constituting a substrate 110. Such a soft circuit board 750 may cover all third surfaces 123, 133 of first and second semiconductor dies 120, 130 as well as the four sides of the substrate 110. Moreover, the soft circuit board 750 may cover the four sides of the substrate 110 and the four sides of the first and second semiconductor dies 120, 130 all together, and simultaneously further extends outwardly by a certain length. The extended region of the soft circuit board 750 is formed with at least an electrically conductive pad 753 connected to the electrically conductive patterns 752. Of course, the electrically conductive pads 753 may become a region to be connected to an external device. Also, the soft circuit board 750 may be further formed on its outer surface with electrically conductive patterns with which at least a semiconductor die can be stacked. Here, the electrically conductive patterns 752 and the electrically conductive pads 753 are formed on a soft insulative layer 751. To facilitate understanding of the drawings, only one of the electrically conductive patterns 752 formed on the soft circuit board 750 is shown therein.

In this way, electrical signals from the electrically conductive terminals 117 of the substrate 110 can be transferred to an external device via the electrically conductive patterns 752 and the electrically conductive pads 753.

In another embodiment, the electrically conductive patterns 752 and the electrically conductive pads 753 are formed on both the outer and inner surfaces of the soft circuit board 750 and are connected through electrically conductive vias or otherwise electrically connected. In this manner, a first semiconductor die 120 or a wafer level stacked package 700 can be connected again to the four sides of the wafer level stacked package 700.

Hereinafter, a description will be given for a method for manufacturing a wafer level package 100 in accordance with an embodiment of the present invention.

Figure 8A:
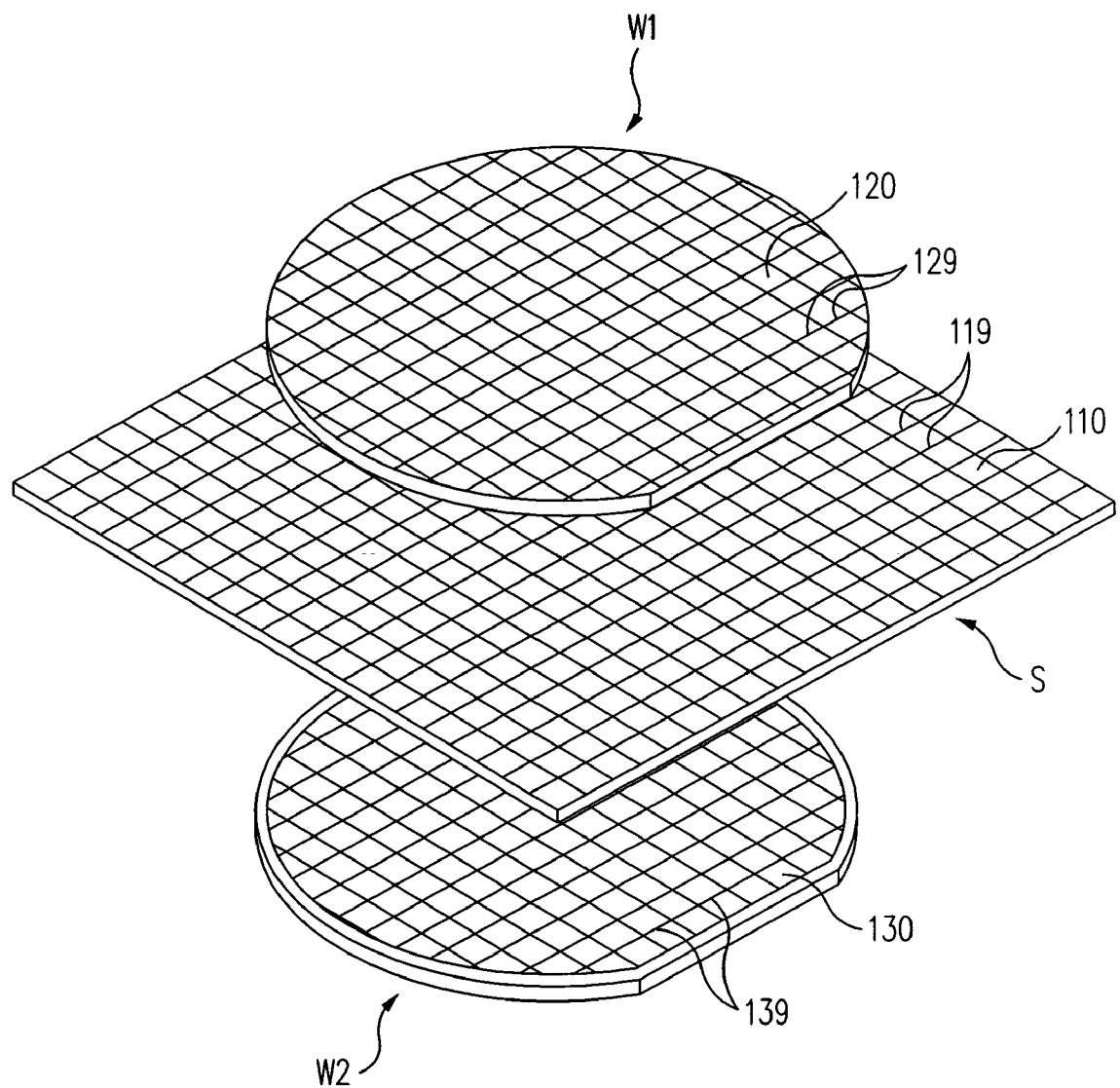
FIG. 8A is a perspective view showing an operation of locating wafers on upper and lower surfaces of a substrate in a method for manufacturing a wafer level stacked package in accordance with an embodiment of the present invention.

Referring to FIG. 8A, FIG. 8A illustrates a perspective view showing a state where wafers are located on upper and lower surfaces of a substrate strip in the manufacturing method of a wafer level stacked package in accordance with this embodiment of the present invention.

As shown in the drawing, there are provided a first wafer w1 in which a plurality of semiconductor dies 120 are formed and delimited by scribe lines 129, a second wafer w2 in which a plurality of semiconductor dies 130 are formed and delimited by scribe lines 139, and a strip s in which a plurality of substrates 110 are formed and delimited by scribe lines 119. Here, individual semiconductor dies 120, 130 formed in the first and second wafers w1, w2 have the same area as that of individual substrates 110 formed in the strip s.

Figure 8B:
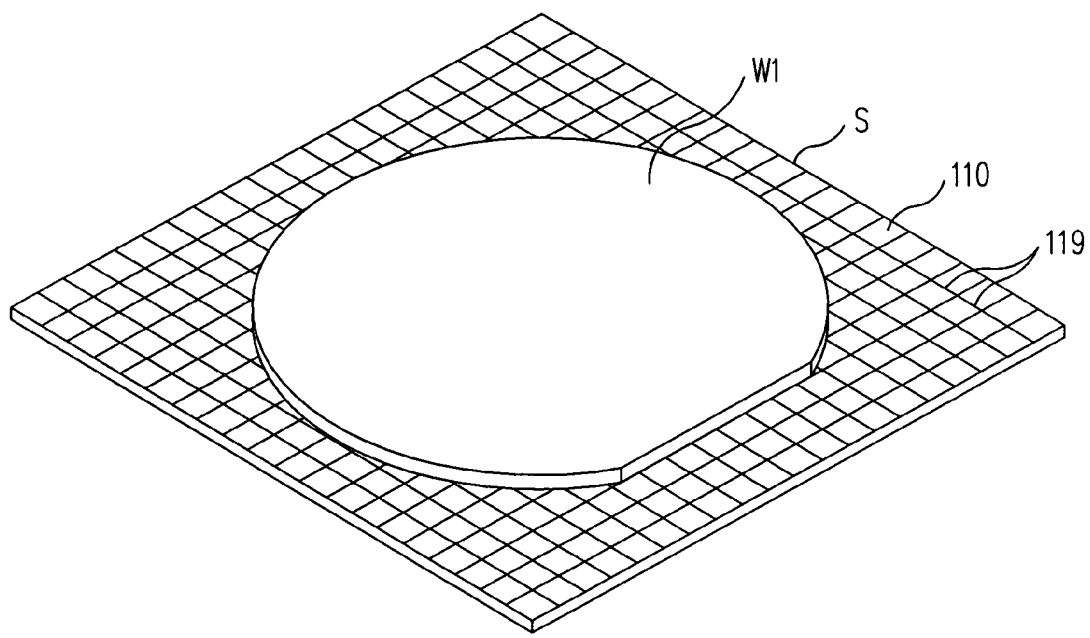
FIG. 8B is a perspective view showing an operation of electrically connecting the wafers to the upper and lower surfaces of the substrate in the manufacturing method of a wafer level stacked package according to the present invention.

Referring to FIG. 8B, FIG. 8B illustrates a perspective view showing a state where the wafers are electrically connected to the upper and lower surfaces of the substrate strip in the manufacturing method of a wafer level stacked package according to the present invention.

As shown in the drawing, the first wafer w1, the strip s and the second wafer w2 are electrically connected to each other. That is, each semiconductor die 120 formed in the first wafer w1 is electrically connected to one surface of each substrate 110 formed in the strip s, and each semiconductor die 130 formed in the second wafer w2 is electrically connected to an opposite surface of each substrate 110 formed in the strip s.

Figure 8C:
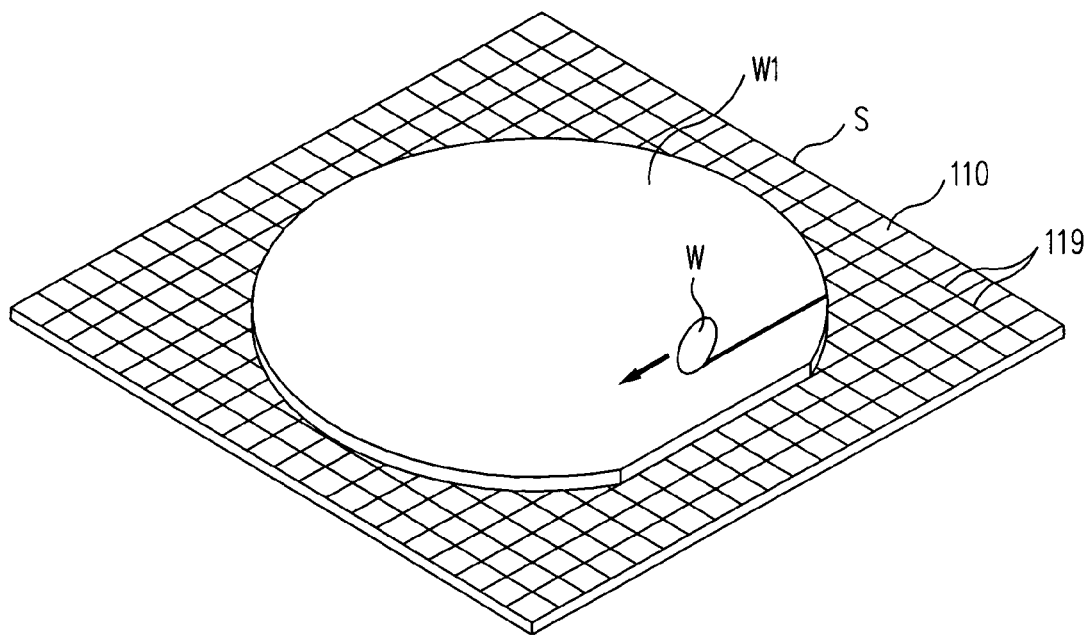
FIG. 8C is a perspective view showing an operation of sawing the wafers and the substrate together into individual packages in the manufacturing method of a wafer level stacked package according to the present invention.

Referring to FIG. 8C, FIG. 8C illustrates a perspective view showing a state where the wafers and the substrate strip are sawn together into individual packages in the manufacturing method of a wafer level stacked package according to the present invention.

As shown in the drawing, the wafers w1, w2 and the strip s are sawn, for example, using a diamond wheel w to separate individual wafer level stacked packages after the completion of electrically connecting the first wafer w1, the second wafer w2 and the strip s to each other. That is, by sawing the respective scribe lines 119, 129, 139 formed the first wafer w1, the second wafer w2 and the strip s by means of a diamond wheel w, independent wafer level stacked packages are obtained.

Figure 8D:
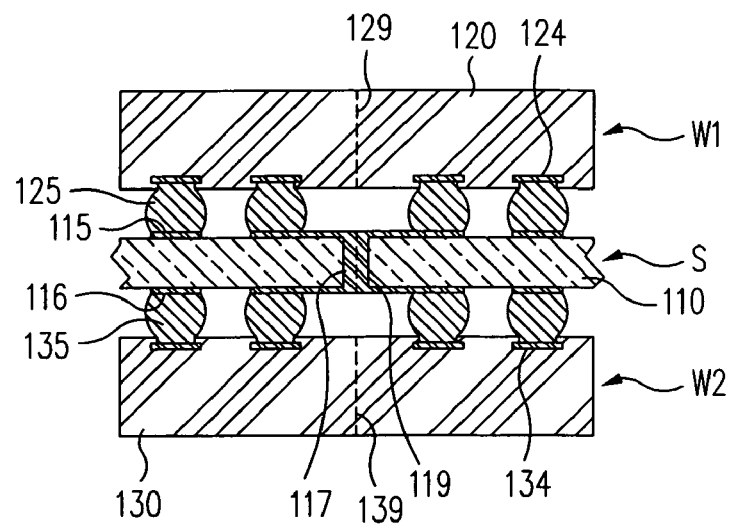
FIG. 8D is a sectional view showing a state where semiconductor dies are electrically connected to the substrates in the manufacturing method of a wafer level stacked package according to the present invention.

Referring to FIG. 8D, FIG. 8D illustrates a sectional view showing a state where the semiconductor dies are electrically connected with respect to the substrates in the manufacturing method of a wafer level stacked package according to the present invention.

As shown in the drawing, the first wafer w1 is formed with a plurality of first semiconductor dies 120, and the plurality of semiconductor dies 120 are delimited by scribe lines 129. Also, each first semiconductor die 120 is formed on its one surface with at least a bond pad 124. Similarly, the second wafer w2 is formed with a plurality of second semiconductor dies 130, and the plurality of semiconductor dies 130 are delimited by scribe lines 139. Of course, each second semiconductor die 130 has at least a bond pad 134 on its one surface.

The strip s is formed with a plurality of substrates 110, and the plurality of substrates 110 are delimited by scribe lines 119. Also, a first electrically conductive pattern 115 and a second electrically conductive pattern 116 are formed on upper and lower surfaces of each substrate 110, respectively, and the first and second electrically conductive patterns 115, 116 can be connected to each other via electrically conductive terminal 117 in a region approximately corresponding to the scribe line 119. This electrically conductive terminal 117 takes the form of a viahole filled with a conductor. Here, the electrically conductive terminal 117 has a larger thickness than a sawing width so that it can be exposed outwardly on a side of the substrate 110 after a later sawing operation.

Each first semiconductor die 120 of the first wafer w1 has a bond pad 124 which is connected to the first electrically conductive pattern 115 of the substrate 110 by means of an electrically conductive bump 125, and each semiconductor die 130 of the second wafer w2 has a bond pad 134 which is connected to the second electrically conductive pattern 116 of the substrate 110 by means of an electrically conductive bump 135.

Figure 8E:
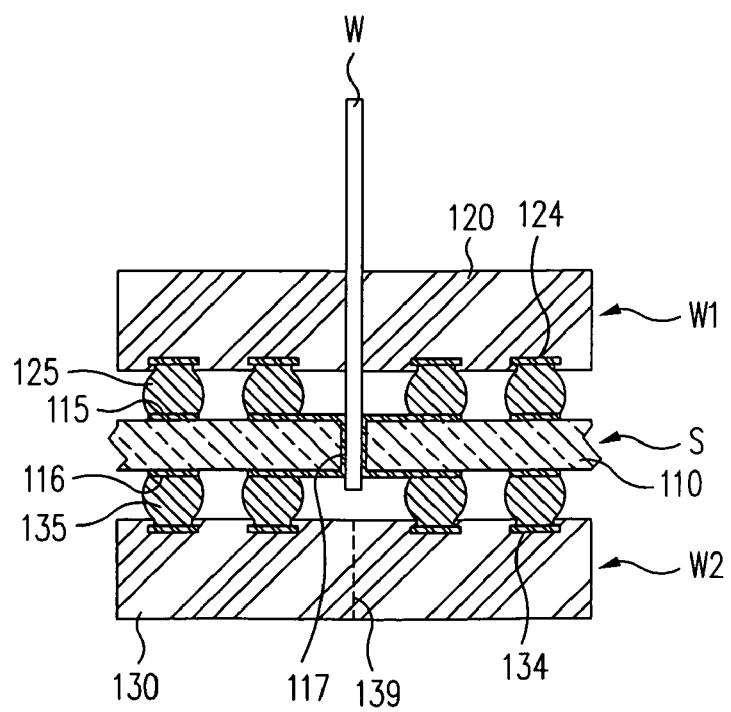
FIG. 8E is a sectional view showing a state where the wafers and the substrate are sawn into individual packages in the manufacturing method of a wafer level stacked package according to the present invention.

Referring to FIG. 8E, FIG. 8E illustrates a sectional view showing a state where the wafers and the substrate are sawn into individual packages in the manufacturing method of a wafer level stacked package according to the present invention.

As shown in the drawing, the first wafer w1, the second wafer w2 and the strip s are integrally sawn by a diamond wheel or the like along the scribe lines 119, 129, 139. At this time, since the electrically conductive terminal 117 is formed with a larger thickness than that of the diamond wheel w or the scribe lines 119, 129, 139, it is exposed outwardly on a side of the substrate 110 after the sawing operation.

Figure 8F:
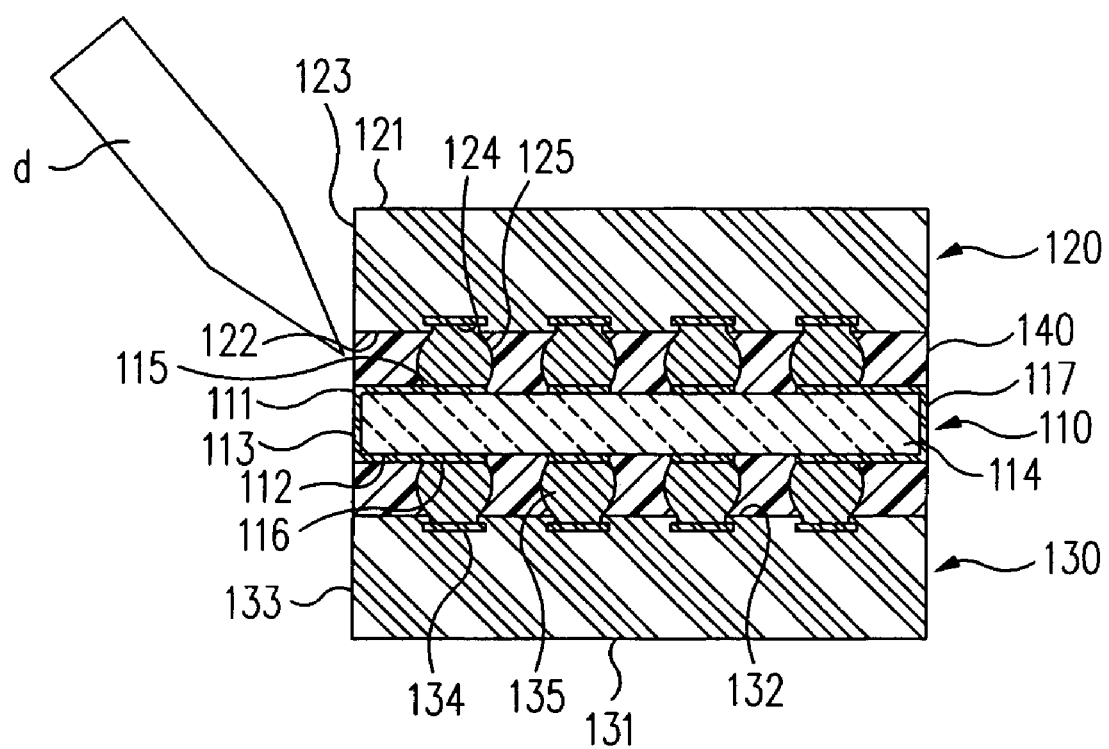
FIG. 8F is a sectional view showing an underfilling operation in the manufacturing method of a wafer level stacked package according to the present invention.

Referring to FIG. 8F, FIG. 8F illustrates a sectional view showing an underfilling process in the manufacturing method of a wafer level stacked package according to the present invention.

As shown in the drawing, underfill 140 such as epoxy underfill or silicon underfill is injected from a dispenser d into a gap between the first semiconductor die 120 and the substrate 110, and a gap between the second semiconductor die 130 and the substrate 110 after the sawing operation. This underfill 140 not only prevents oxidation of the electrically conductive bumps 125, 135, but also serves to increase bonding forces between the first semiconductor die 120 and the substrate 110, and between the second semiconductor die 130 and the substrate 110. That is, the underfill 140 improves mechanical strength and reliability of the wafer level stacked package 100.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A wafer level stacked package comprising:
   a substrate comprising:
      an insulative layer having a first surface, a second surface being opposite to the first surface, and four third surfaces being formed around and substantially perpendicular to the first and second surfaces;
      at least an electrically conductive terminal formed on the third surfaces of the insulative layer;
      at least a first electrically conductive pattern formed on the first surface of the insulative layer; and
      at least a second electrically conductive pattern formed on the second surface of the insulative layer;
   a first semiconductor die being connected to the first surface of the insulative layer, wherein the first semiconductor die comprises:
      a first surface;
      a second surface being opposite to the first surface of the first semiconductor die and formed with at least a bond pad; and
      four third surfaces being formed around and substantially perpendicular to the first and second surfaces of the first semiconductor die, wherein each third surface of the first semiconductor die and each corresponding third surface of the insulative layer are substantially coplanar with one another and form the same plane; and
   a second semiconductor die being connected to the second surface of the insulative layer, wherein the second semiconductor die comprises:
      a first surface;
      a second surface being opposite to the first surface of the second semiconductor die and being formed with at least a bond pad; and
      four third surfaces being formed around and substantially perpendicular to the first and second surfaces of the second semiconductor die, wherein each third surface of the second semiconductor die and each corresponding third surface of the insulative layer are substantially coplanar with one another and form the same plane.

2. The wafer level stacked package as claimed in claim 1, wherein at least an electrically conductive bump is interposed between the bond pad and the first electrically conductive pattern.

3. The wafer level stacked package as claimed in claim 1, wherein at least an electrically conductive bump is interposed between the bond pad and the second electrically conductive pattern.

4. The wafer level stacked package as claimed in claim 1, wherein the electrically conductive terminal is connected to the first electrically conductive pattern, the second electrically conductive pattern or the first and second electrically conductive patterns.

5. A wafer level stacked package comprising:
   a substrate comprising:
      an insulative layer having a first surface, a second surface being opposite to the first surface, and four third surfaces being formed around and substantially perpendicular to the first and second surfaces; and
      at least an electrically conductive terminal formed on the third surfaces of the insulative layer;
   a first semiconductor die being connected to the first surface of the insulative layer, wherein the first semiconductor die comprises:

a first surface;
a second surface being opposite to the first surface of the first semiconductor die and formed with at least a bond pad; and
four third surfaces being formed around and substantially perpendicular to the first and second surfaces of the first semiconductor die, wherein each third surface of the first semiconductor die and each corresponding third surface of the insulative layer are substantially coplanar with one another and form the same plane;
a second semiconductor die being connected to the second surface of the insulative layer, wherein the second semiconductor die comprises:
a first surface;
a second surface being opposite to the first surface of the second semiconductor die and being formed with at least a bond pad; and
four third surfaces being formed around and substantially perpendicular to the first and second surfaces of the second semiconductor die, wherein each third surface of the second semiconductor die and each corresponding third surface of the insulative layer are substantially coplanar with one another and form the same plane; and
an underfill is interposed between the first semiconductor die and the substrate and between the second semiconductor die and the substrate.

6. The wafer level stacked package as claimed in claim 1, wherein at least one third semiconductor die is further connected to the electrically conductive terminal of the insulative layer by means of an electrically conductive bump.

7. The wafer level stacked package as claimed in claim 1, wherein a lead extending outwardly by a length is further connected to the electrically conductive terminal of the insulative layer by means of a solder.

8. The wafer level stacked package as claimed in claim 1, wherein the substrate, the first semiconductor die and the second semiconductor die are coupled to a socket inside of which is formed an electrically conductive pattern, the electrically conductive terminal of the substrate being electrically connected to the electrically conductive pattern of the socket.

9. The wafer level stacked package as claimed in claim 1, wherein the substrate, the first semiconductor die and the second semiconductor die are coupled to an external board formed with a cavity and a plurality of electrically conductive patterns formed outside of the cavity, wherein the electrically conductive terminal of the substrate is connected to the electrically conductive patterns of the external board by means of solders.

10. The wafer level stacked package as claimed in claim 1, wherein a flexible circuit board formed with an electrically conductive pattern is further connected to the electrically conductive terminal of the substrate.

11. The wafer level stacked package as claimed in claim 10, wherein the flexible circuit board covers circumferences of the substrate on four sides.

12. A wafer level stacked package comprising:
first and second wafer level stacked packages each comprising:
a substrate comprising:
an insulative layer having a first surface, a second surface being opposite to the first surface, and four third surfaces being formed around and substantially perpendicular to the first and second surfaces; and
at least an electrically conductive terminal formed on the third surfaces of the insulative layer;
a first semiconductor die being connected to the first surface of the insulative layer, wherein the first semiconductor die comprises:
a first surface;
a second surface being opposite to the first surface of the first semiconductor die and formed with at least a bond pad; and
four third surfaces being formed around and substantially perpendicular to the first and second surfaces of the first semiconductor die, wherein each third surface of the first semiconductor die and each corresponding third surface of the insulative layer are substantially coplanar with one another and form the same plane; and
a second semiconductor die being connected to the second surface of the insulative layer, wherein the second semiconductor die of the second wafer level stacked package is mounted on the first semiconductor die of the first wafer level stacked package, wherein the second semiconductor die comprises:
a first surface;
a second surface being opposite to the first surface of the second semiconductor die and being formed with at least a bond pad; and
four third surfaces being formed around and substantially perpendicular to the first and second surfaces of the second semiconductor die, wherein each third surface of the second semiconductor die and each corresponding third surface of the insulative layer are substantially coplanar with one another and form the same plane.

13. The wafer level stacked package as claimed in claim 12 wherein an adhesive mounts the second semiconductor die of the second wafer level stacked package on the first semiconductor die of the first wafer level stacked package.

14. The wafer level stacked package as claimed in claim 12 wherein an oxide film mounts the second semiconductor die of the second wafer level stacked package on the first semiconductor die of the first wafer level stacked package.

15. The wafer level stacked package as claimed in claim 12, wherein each substrate further comprises:
at least a first electrically conductive pattern formed on the first surface of the insulative layer; and
at least a second electrically conductive pattern formed on the second surface of the insulative layer.

16. The wafer level stacked package as claimed in claim 12, wherein the first and second wafer level stacked packages each comprise an underfill interposed between the first semiconductor die and the substrate and between the second semiconductor die and the substrate.

17. A wafer level stacked package comprising:
a substrate comprising:
an insulative layer having a first surface, a second surface being opposite to the first surface, and four third surfaces being formed around and substantially perpendicular to the first and second surfaces;
at least a first electrically conductive pattern formed on the first surface of the insulative layer;
at least a second electrically conductive pattern formed on the second surface of the insulative layer; and
at least an electrically conductive terminal formed on the third surfaces of the insulative layer;
a first semiconductor die being connected to the first surface of the insulative layer, wherein the first semiconductor die comprises:

a first surface;
a second surface being opposite to the first surface of the first semiconductor die and formed with at least a bond pad; and
four third surfaces being formed around and substantially perpendicular to the first and second surfaces of the first semiconductor die, and
wherein at least an electrically conductive bump is interposed between the bond pad and the first electrically conductive pattern; and
a second semiconductor die being connected to the second surface of the insulative layer, wherein the second semiconductor die comprises:
a first surface;
a second surface being opposite to the first surface of the second semiconductor die and being formed with at least a bond pad; and
four third surfaces being formed around and substantially perpendicular to the first and second surfaces of the second semiconductor die,
wherein at least an electrically conductive bump is interposed between the bond pad of the second semiconductor die and the second electrically conductive pattern; and
wherein the areas of the substrate, the first semiconductor die and the second semiconductor die are approximately equal.

* * * * *